(12) United States Patent
Liu

(10) Patent No.: US 11,131,918 B2
(45) Date of Patent: Sep. 28, 2021

(54) LIGHT SOURCE ASSEMBLY

(71) Applicant: Hsueh-Ting Liu, Zhubei (TW)

(72) Inventor: Hsueh-Ting Liu, Zhubei (TW)

(*) Notice: Subject to any disclaimer, the term of this patent is extended or adjusted under 35 U.S.C. 154(b) by 0 days.

(21) Appl. No.: 17/090,253

(22) Filed: Nov. 5, 2020

(65) Prior Publication Data

US 2021/0157224 A1   May 27, 2021

(30) Foreign Application Priority Data

Nov. 22, 2019  (TW) .................................. 108142481
Jan. 17, 2020  (TW) .................................. 109101674
Sep. 26, 2020  (TW) .................................. 109133502

(51) Int. Cl.
| | | |
|---|---|---|
| *G03B 33/00* | (2006.01) | |
| *G02B 27/10* | (2006.01) | |
| *G03B 21/16* | (2006.01) | |
| *G03B 21/20* | (2006.01) | |
| *H01L 33/50* | (2010.01) | |

(52) U.S. Cl.
CPC ......... *G03B 33/00* (2013.01); *G02B 27/1006* (2013.01); *G03B 21/16* (2013.01); *G03B 21/204* (2013.01); *G03B 21/2066* (2013.01); *H01L 33/504* (2013.01)

(58) Field of Classification Search
None
See application file for complete search history.

(56) References Cited

U.S. PATENT DOCUMENTS 9,429,831 B2   8/2016 Akiyama
10,571,788 B2   2/2020 Akiyama

*Primary Examiner* — Vip Patel
(74) *Attorney, Agent, or Firm* — Birch, Stewart, Kolasch & Birch, LLP

(57) ABSTRACT

A light source assembly includes a light source unit, a light collecting unit, a light separating unit and a light converting unit. The light source unit generates a first light beam having a first color and a first optical path. The light collecting unit has a light entering side and a light exiting side and is configured to collimate and condense the light beam incident on the light entering side. The light separating unit is disposed on an area between the light entering side and the light exiting side of the light collecting unit for reflecting the first light beam entering from the light entering side of the light collecting unit. The light converting unit absorbs the first light beam reflected from a light separating unit and generates a converted light beam having a second color.

19 Claims, 11 Drawing Sheets

LIGHT SOURCE ASSEMBLY

BACKGROUND OF THE INVENTION

1. Field of the Invention

The present invention relates to an equipment for a projector, and more particularly to a light source assembly for a projector.

2. Description of the Related Art

U.S. Pat. No. 9,429,831 disclosed a prior art lighting device for a projector. The lighting device must provide a specific space, as shown in FIG. 2 of the patent, to accommodate the first prism 25A for performing wavelength selectivity. Similarly, the light source device of a projector disclosed in the U.S. Pat. No. 10,571,788 must also provide a specific space in the projector, as shown in FIG. 1 of the patent, to install the light separating element 730. A common disadvantage of these light source devices mentioned above is that a specific space must be reserved inside the projector to accommodate the prior art lighting source devices. This disadvantage is quite unfavorable to the design of reducing the size of the projector. In other words, a light source that can reduce the size of the projector has always been needed.

SUMMARY OF THE INVENTION

Thus, in one aspect of the present invention, an improved light source assembly is provided. The light source assembly comprises a light source unit, a light collecting unit, a light separating unit and a light converting unit. The light source unit is configured to generate a first light beam having a first color and a first optical path. The light collecting unit is disposed on the first optical path of the first light beam and has a light entering side and a light exiting side. The light collecting unit is configured to collimate and condense the light beam incident on the light entering side thereof. The light separating unit is disposed on an area between the light entering side and the light exiting side of the light collecting unit for reflecting the first light beam entering from the light entering side of the light collecting unit. The light converting unit is configured to absorb the first light beam reflected from a light separating unit and generate a converted light beam having a second color. The converted light beam is incident on the light entering side of the light collecting unit and exits outwardly from the light exiting side of the light collecting unit.

The light source unit of the above light source assembly comprises a laser light source or an LED-based light source.

A feature of the above light source assembly is that the light converting unit includes a first plane, the light collecting unit comprises a first plano-convex lens including a first light entering flat surface located near the light entering side thereof and parallel to the first plane of the light converting unit, a first light exiting convex surface located near the light exiting side, and an optical axis perpendicular to the first plane of the light converting unit. And the light separating unit comprises a first dichroic coating disposed on a first portion of the first light exiting convex surface.

Another feature of the above light source assembly is that the first optical path of the first light beam is parallel to the optical axis of the first plano-convex lens.

Another feature of the above light source assembly is that the first optical path of the first light beam intersects the optical axis of the first plano-convex lens at a predetermined angle being greater than 0 degrees and less than 90 degree.

In a preferred embodiment, the light collecting unit of the above light source assembly further comprises a second plano-convex lens including a second light entering flat surface and a second light exiting convex surface. The second plano-convex lens and the first plano-convex lens are coaxially arranged between the light entering side and the light exiting side of the light collecting unit in such a way that the second light entering flat surface is adjacent to the first light exiting convex surface of the first plano-convex lens. The light separating unit comprises a second dichroic coating disposed on a first portion of the second light entering flat surface of the second plano-convex lens.

In another preferred embodiment, the light collecting unit of the above light source assembly further comprises a second plano-convex lens including a second light entering flat surface and a second light exiting convex surface. The second plano-convex lens and the first plano-convex lens are coaxially arranged between the light entering side and the light exiting side of the light collecting unit in such a way that the second light entering flat surface is adjacent to the first light exiting convex surface of the first plano-convex lens. The light separating unit includes a dichroic beamsplitter arranged between the first light exiting convex surface of the first plano-convex lens and the second light entering flat surface of the second plano-convex lens.

In some embodiments of the present invention, the light source assembly comprises a light converting unit including a wavelength conversion layer with a first wavelength converting material and a heat dissipating substrate on which the wavelength conversion layer is disposed.

A feature of the above light source assembly is that the heat dissipating substrate is rotatable.

Another feature of the above light source assembly is that the wavelength conversion layer includes a first wavelength converting section with a first wavelength converting material and a second wavelength converting section with a second wavelength converting material.

A yet another feature of the above light source assembly the heat dissipating substrate further comprises a reflection section for reflecting the first light beam reflected from the light separating unit.

In yet another preferred embodiment of the present invention, the light source assembly comprises a heat dissipating substrate further including a transmission section for transmitting the first light beam reflected from the light separating unit.

BRIEF DESCRIPTION OF THE DRAWINGS

The various features, advantages and other uses of the present invention will become more apparent by referring to the following detailed description and drawing in which.

DETAILED DESCRIPTION OF THE PREFERRED EMBODIMENTS

Figure 1:
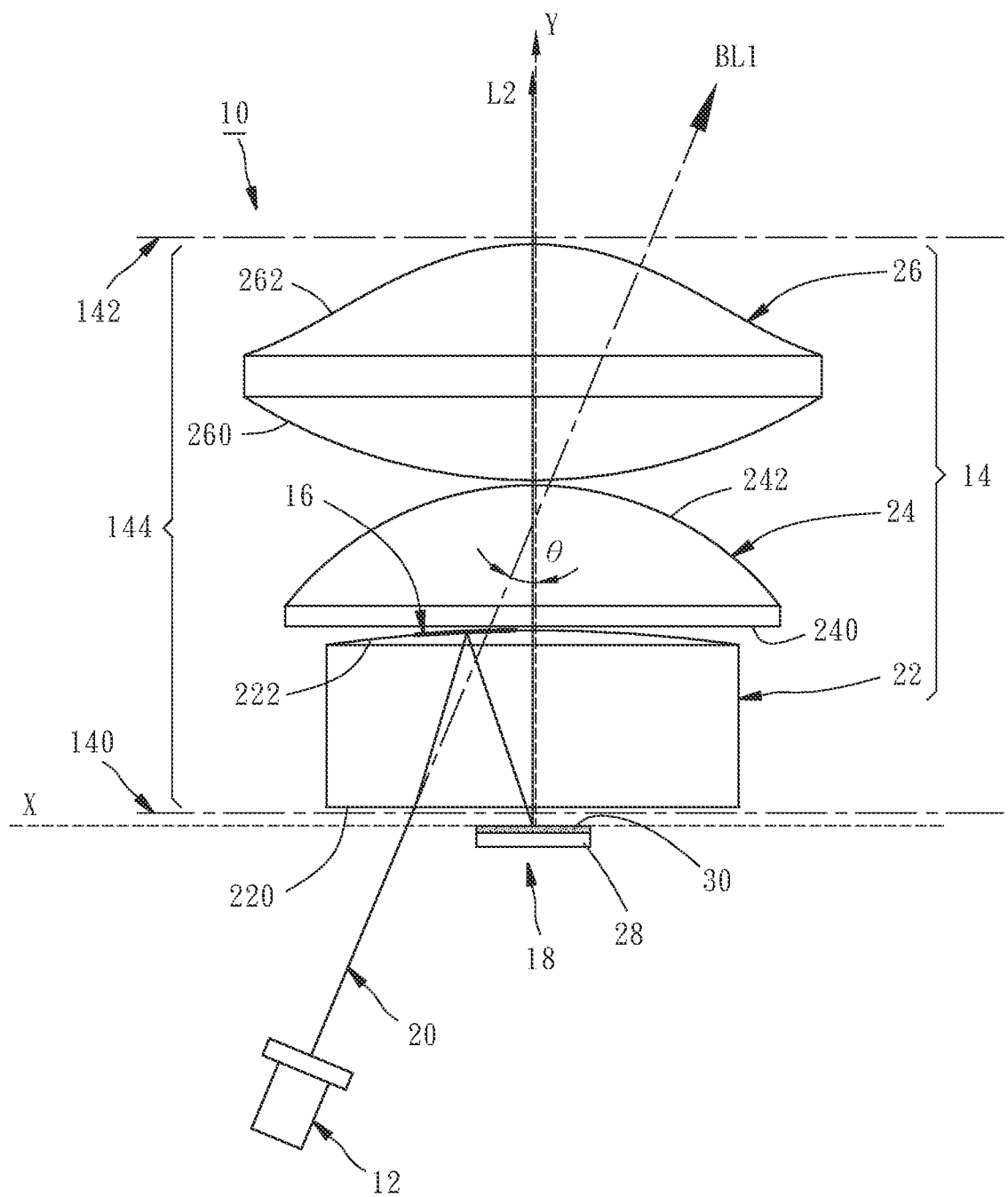
FIG. 1 is a schematic configuration diagram of a light source assembly according to a first embodiment of the present invention.
Figure 2:
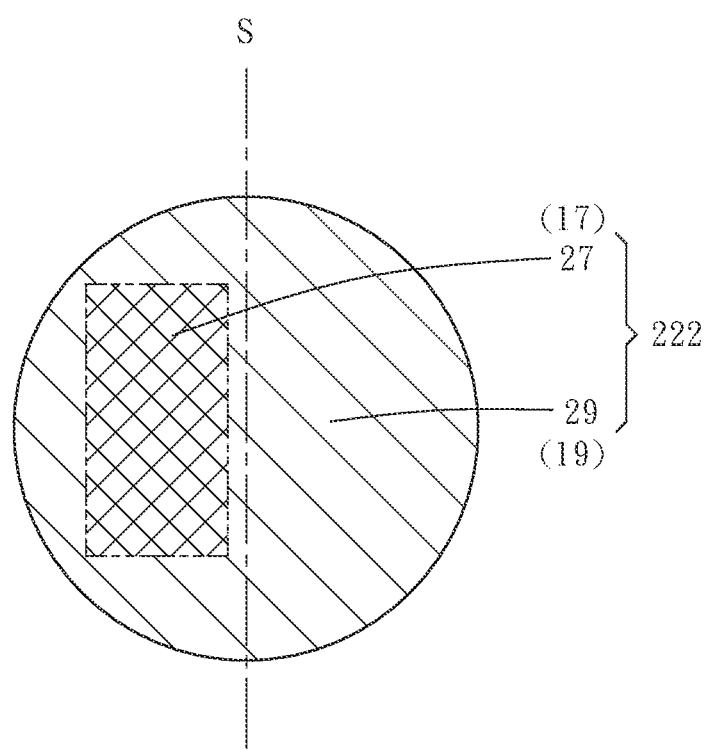
FIG. 2 is a schematic diagram of a first plano-convex lens of the light source assembly as shown in FIG. 1 on which a dichroic coating and an anti-reflection coating is disposed.

Referring firstly to FIGS. 1 and 2, a light source assembly 10 according to a first embodiment of the invention is shown. The light source assembly 10 comprises a light source unit 12, a light collecting unit 14, a light separating unit 16 and a light converting unit 18.

The light source unit 12 generally is a laser light source or an LED-based light source for providing a first light beam of a first color. In this embodiment, the light source unit 12 is a laser light source and generates a blue light beam 20 with a first optical path BL1.

The light collecting unit 14 is disposed on the first optical path BL1 of the blue light beam 20 and has a light entering side 140 and a light exiting side 142. The light collecting unit 14 is configured to collimate and condense the light beam incident on the light entering side 140. The light collecting unit 14 may include one or more lenses. In this embodiment, The light collecting unit 14 comprises a first plano-convex lens 22, a second plano-convex lens 24 and a double-convex aspheric lens 26 all of which are disposed on an area 144 between the light entering side 140 and the light exiting side 142 of the light collecting unit 14 with a common optical axis Y which intersects the first optical path BL1 at a predetermined angle θ greater than 0 degrees and less than 90 degrees, preferably, between 30 degrees and 45 degrees.

The light separating unit 16 is disposed on the area 144 where the light collecting unit 14 is located. The light converting unit 18 is configured to absorb the first light beam 20 reflected from a light separating unit 16 and generate a converted light beam L2 having a different color than the color of the first light beam 20. In this embodiment, the light converting unit 18 has a first plane X which is perpendicular to the common optical axis Y. The light converting unit 18 comprises a wavelength conversion layer 30 and a heat dissipating substrate 28 on which the wavelength conversion layer 30 is disposed.

The light source assembly 10 is described in more detail below. The first plano-convex lens 22 has a first light entering flat surface 220 located near the light entering side 140 and parallel to the first plane X of the light converting unit 18 and a first light exiting convex surface 222. The second plano-convex lens 24 has a second light entering flat surface 240 and a second light exiting convex surface 242. The double-convex aspheric lens 26 has a light entering convex flat surface 260 and a third light exiting convex surface 262. The first plano-convex lens 22, the second plano-convex lens 24 and the double-convex aspheric lens 26 are coaxially arranged between the light entering side 140 and the light exiting side 142 of the light collecting unit 14. The second light entering flat surface 240 is adjacent to the first light exiting convex surface 222 of the first plano-convex lens 22. The light entering convex surface 260 is adjacent to the second light exiting convex surface 242. The third light exiting convex surface 262 is near the light exiting side 142.

The light separating unit 16 includes a dichroic coating 17 disposed on a first portion 27 of the first light exiting convex surface 222. The light collecting unit 14 further comprises an anti-reflection coating 19 disposed on the second portion 29 of the first light exiting convex surface 222. In this embodiment, as shown in FIG. 2, the first light exiting convex surface 222 is divided into halves by a second plane S. The light source unit 12 and the dichroic coating 17 are both disposed on the left side of the second plane S. Preferably, the area of the first portion 27 of the first light exiting surface 222 is less than or equal to 50% of the entire area of the first light exiting surface 222 so that the influence on the incidence of visible light on the light collecting unit 14 can be reduced.

The wavelength conversion layer 30 comprises a first wavelength converting material for absorbing the blue light beam 20 reflected by the dichroic coating 17 and generating a converted light beam with a second color, such as, a red light beam, a green light beam or a yellow light beam. Detailedly speaking, when the blue light beam 20 is incident on the first plano-convex lens 22, it will be reflected by the dichroic coating 17 via the first plano-convex lens 22 and converged into a light spot on the wavelength conversion layer 30 to generate a converted light beam L2 transmitted to the back-end device of a projector via the light collecting unit 14.

Figure 3:
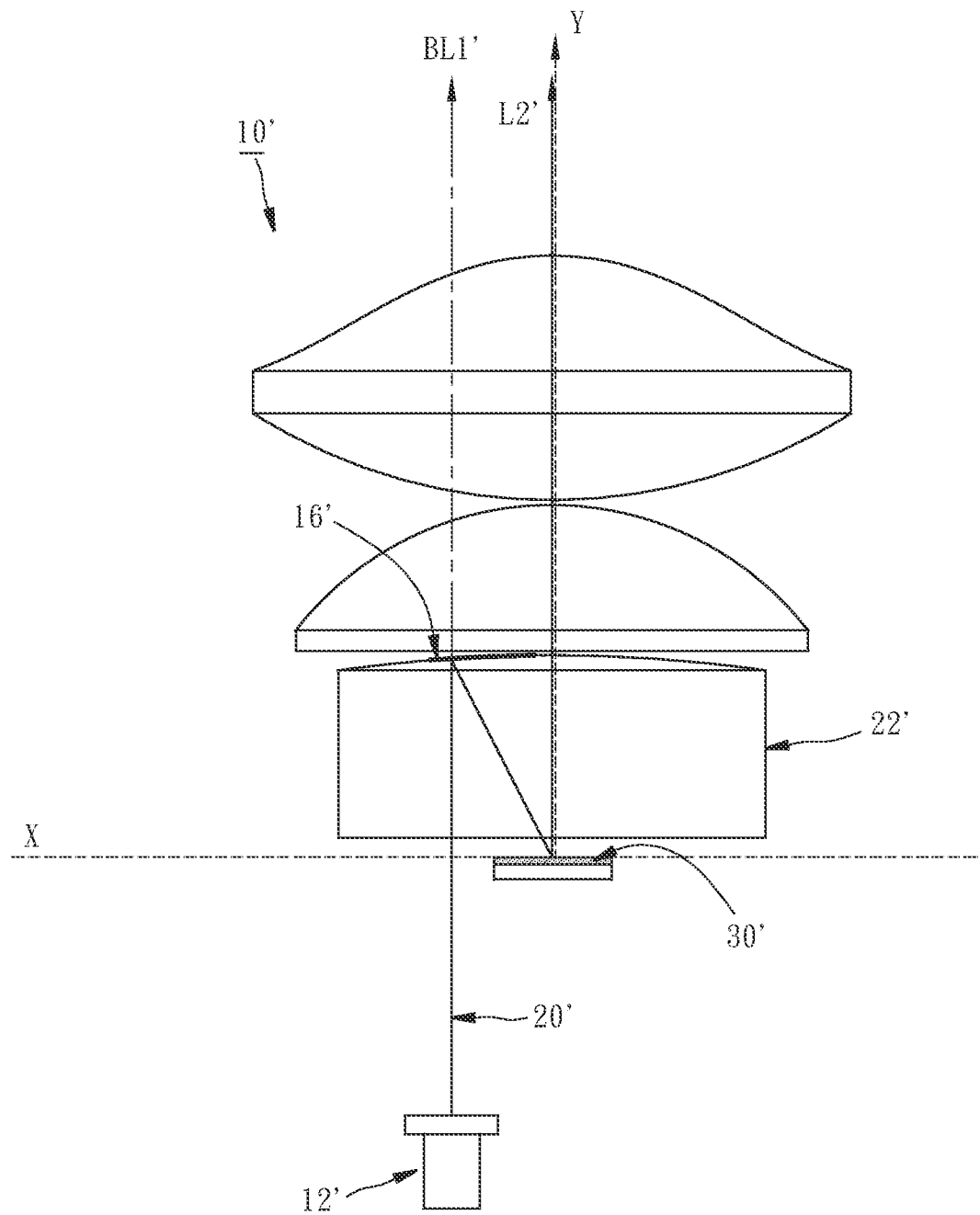
FIG. 3 is a schematic configuration diagram of a light source assembly according to a second embodiment of the present invention.

A light source assembly 10' according to a second embodiment of the invention is shown in FIG. 3. The light source assembly 10' is different from the light source assembly 10 of the first embodiment in that the second optical path BL1' of the blue light beam 20' generated by the light source unit 12' is parallel to the optical axis Y. The blue light beam 20' is incident on the first plano-convex lens 22' and reflected by the light separating unit 16' to the wavelength conversion layer 30' to generate an excitation light beam L2'.

Figure 4:
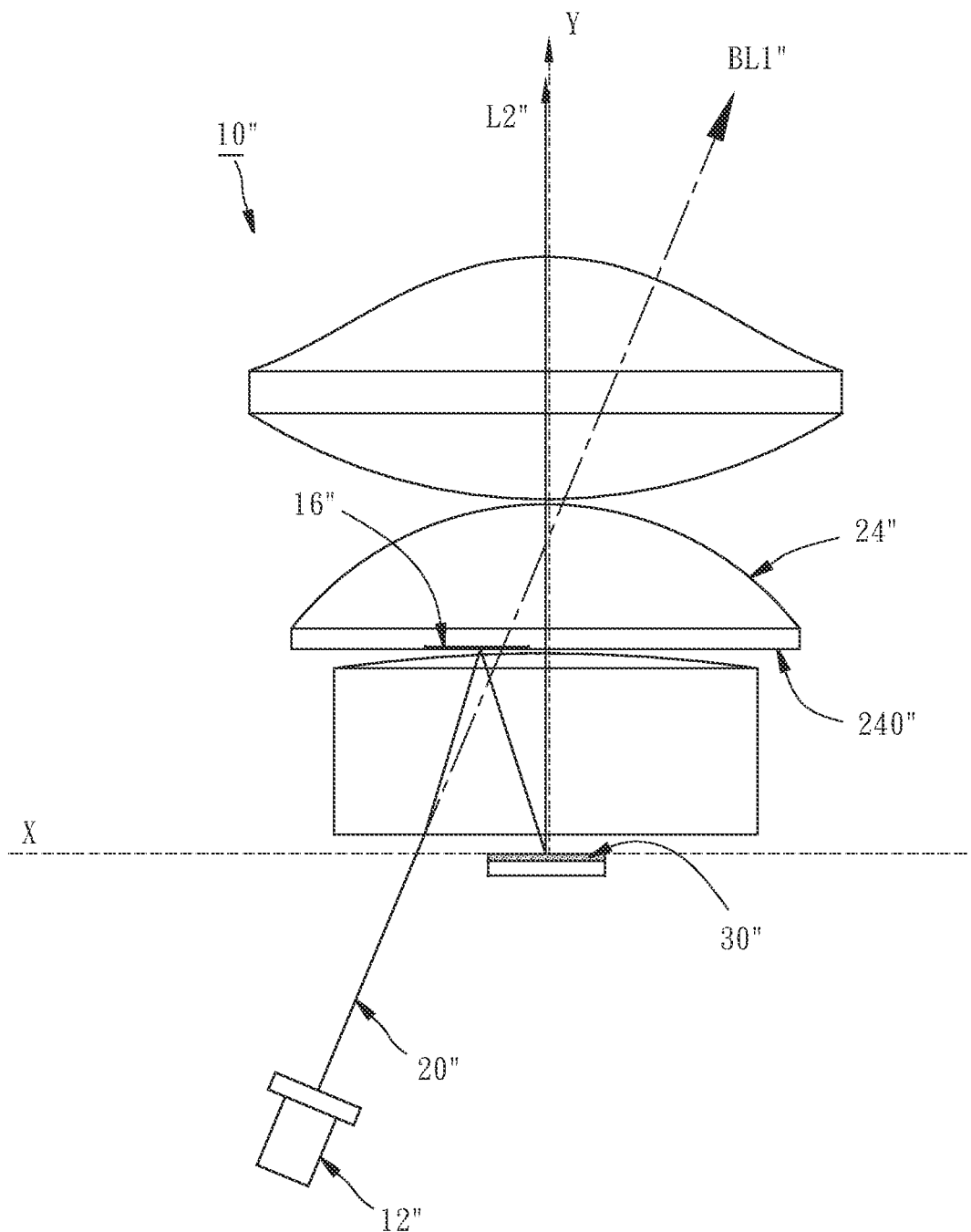
FIG. 4 is a schematic configuration diagram of a light source assembly according to a third embodiment of the present invention.

A light source assembly 10" according to a third embodiment of the invention is shown in FIG. 4. The light source assembly 10" is different from the light source assembly 10 of the first embodiment in that the light separating unit 16" is disposed on a second light entering flat surface 240" of a second plano-convex lens 24". The blue light beam 20" generated by the light source unit 12" is incident on the second plano-convex lens 24" via the first plano-convex lens 22" and reflected by the light separating unit 16" to the wavelength conversion layer 30" to generate an excitation light beam L2".

Figure 5:
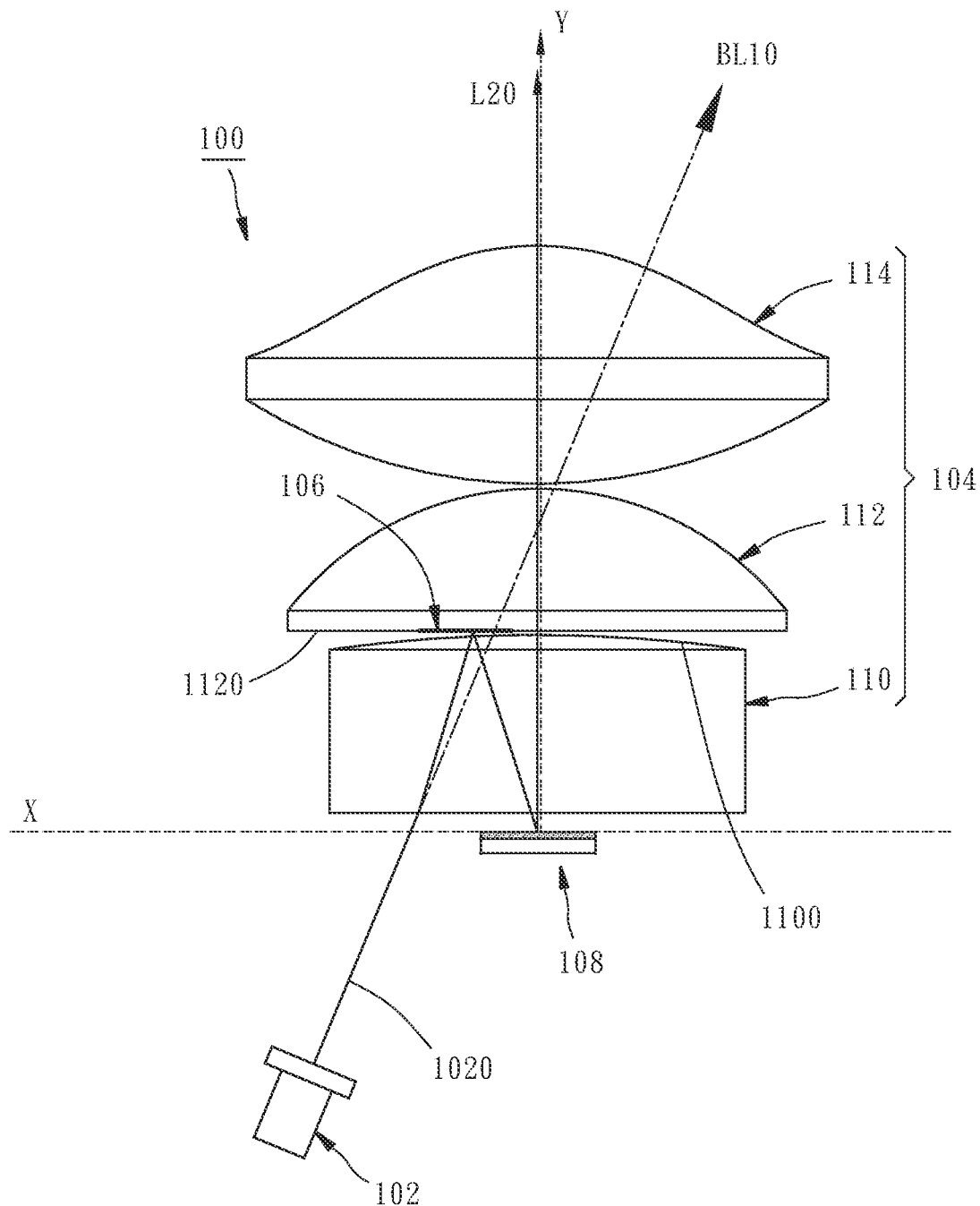
FIG. 5 is a schematic configuration diagram of a light source assembly according to a fourth embodiment of the present invention.

Referring now to FIG. 5, a light source assembly 100 according to a fourth embodiment of the invention is shown. The light source assembly 100 comprises a light source unit 102, a light collecting unit 104, a light separating unit 106 and a light converting unit 108. The light collecting unit 104 comprises a first plano-convex lens 110, a second plano-convex lens 112 and a double-convex aspheric lens 114. The light source assembly 100 is different from the light source assembly 10 of the first embodiment in that the light separating unit 106 is a dichroic beamsplitter arranged between a first light exiting convex surface 1100 of the first plano-convex lens 110 and a second light entering flat surface 1120 of the second plano-convex lens 112. In this embodiment, the light source unit 102 generates a blue light beam 1020 with a first optical path BL10. The blue light beam 1020 is incident on the second plano-convex lens 112 via the first plano-convex lens 110 and reflected by the light separating unit 106 to the light converting unit 108 to generate an excitation light beam L20.

Figure 6:
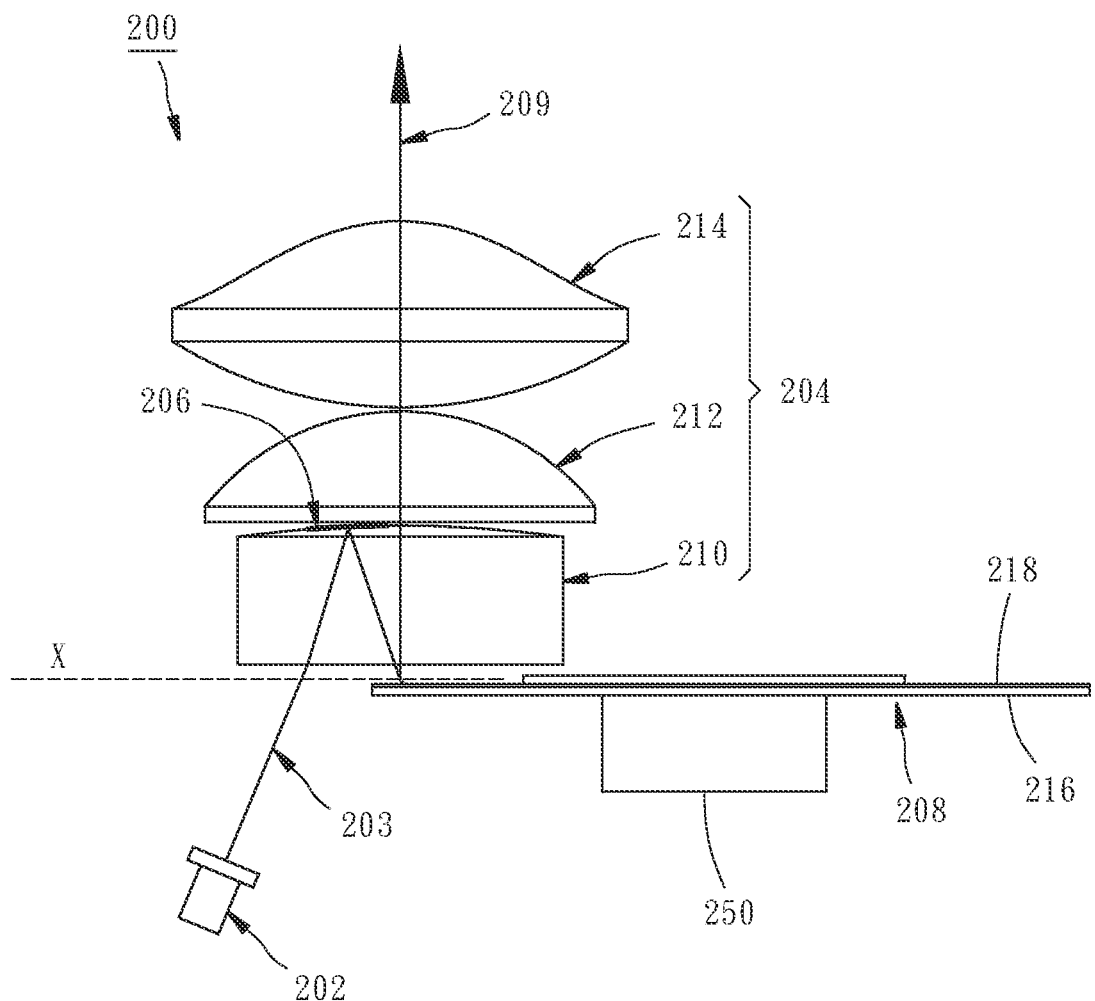
FIG. 6 is a schematic configuration diagram of a light source assembly according to a fifth embodiment of the present invention.
Figure 7:
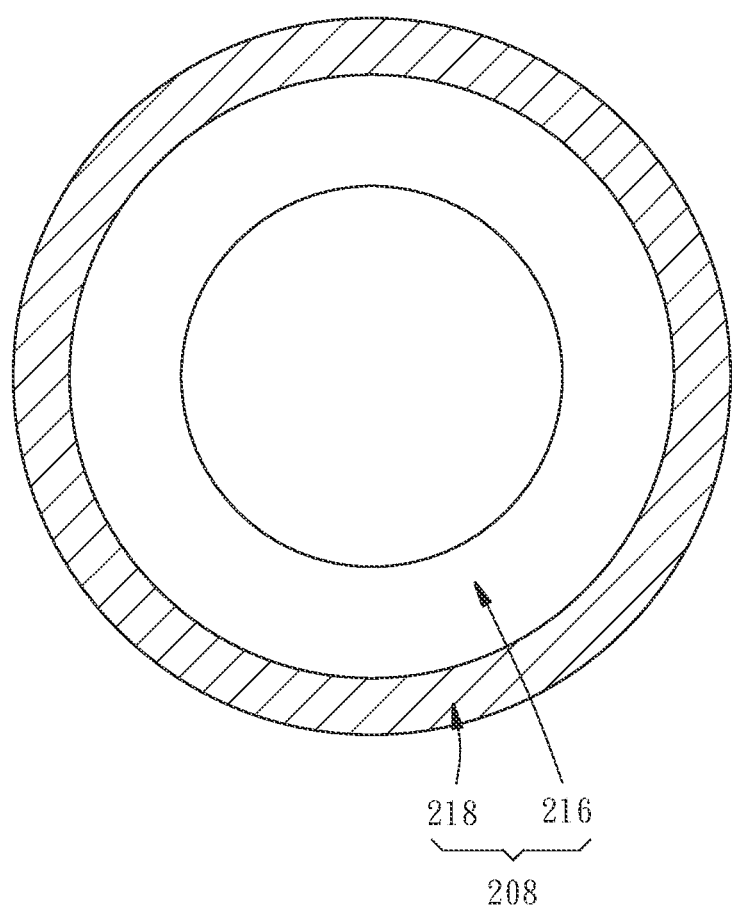
FIG. 7 is a top view of a light converting unit of the light source assembly as shown in FIG. 6.

A light source assembly 200 according to a fifth embodiment of the invention is shown in FIGS. 6 and 7. The light source assembly 200 comprises a light source unit 202, a light collecting unit 204, a light separating unit 206 and a light converting unit 208.

The light collecting unit 204 also comprises a first plano-convex lens 210, a second plano-convex lens 212 and a double-convex aspheric lens 214. The light source assembly 200 is different from the light source assembly 10 of the first embodiment in that the light converting unit 208 comprises a ring-shaped wavelength conversion layer 218 and a wheel-shaped heat dissipating substrate 216 on which the wavelength conversion layer 218 is disposed. The wavelength conversion layer 218 includes a first wavelength converting material. In this embodiment, the wheel-shaped heat dissipation substrate 216 is rotatable and usually driven by a motor 250. The light source unit 202 generates a blue light beam 203 incident on the light collecting unit 204 and reflected by the light separating unit 206 to the light converting unit 208 to generate an excitation light beam 209 transmitted to the back-end device of a projector via the light collecting unit 204.

Figure 8:
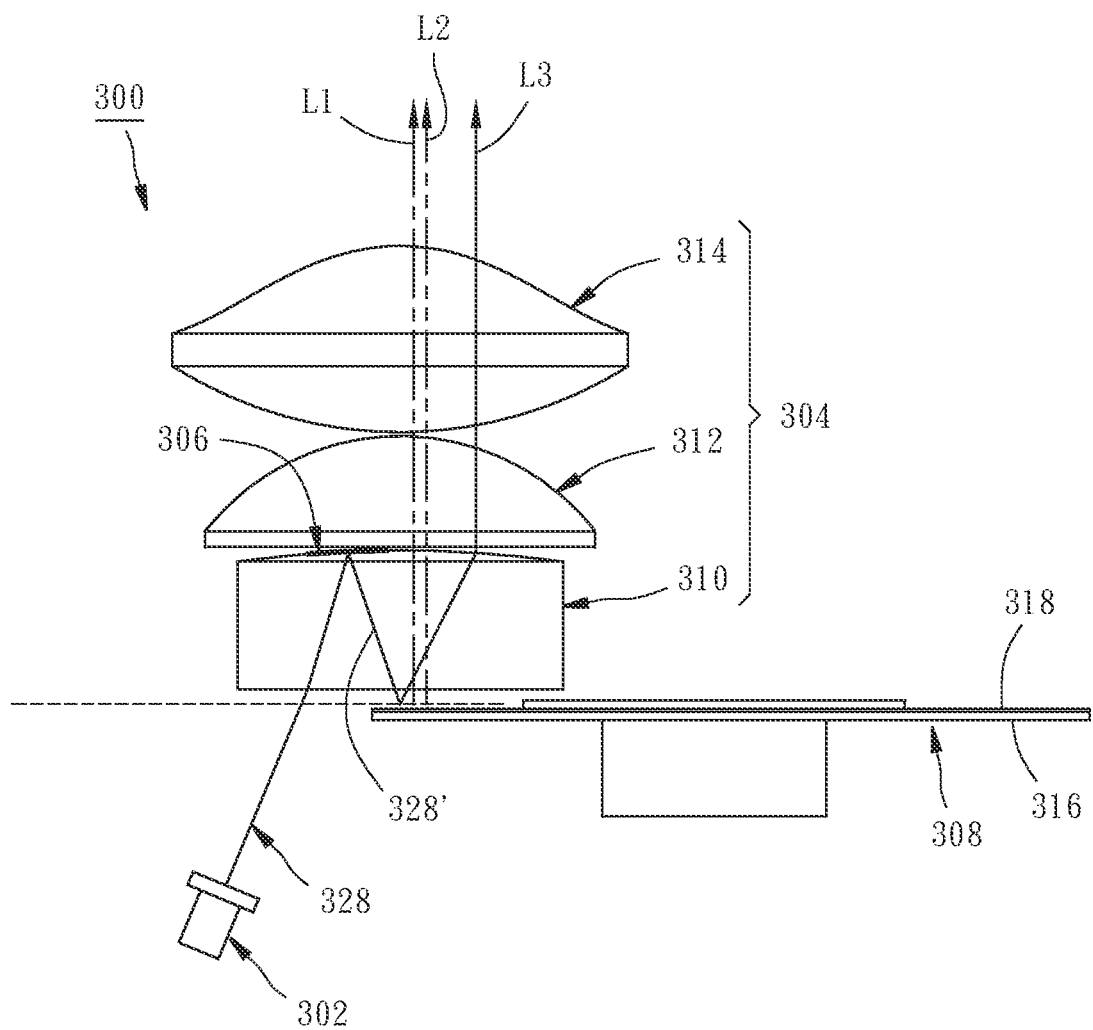
FIG. 8 is a schematic configuration diagram of a light source assembly according to a sixth embodiment of the present invention.
Figure 9:
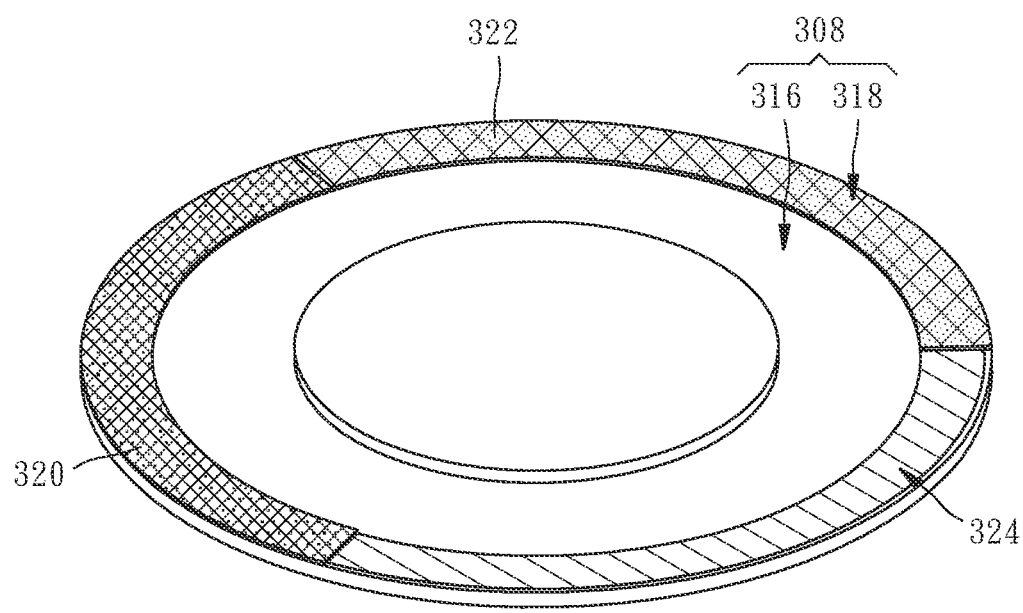
FIG. 9 is a perspective view of a light converting unit of the light source assembly as shown in FIG. 8.

A light source assembly 300 according to a sixth embodiment of the invention is shown in FIGS. 8 and 9. The light source assembly 300 comprises a light source unit 302, a light collecting unit 304, a light separating unit 306 and a light converting unit 308. In this embodiment, the light collecting unit 304 also comprises a first plano-convex lens 310, a second plano-convex lens 312 and a double-convex aspheric lens 314.

The light source assembly 300 is different from the light source assembly 200 of the fifth embodiment in that a wavelength conversion layer 318 disposed on a wheel-shaped heat dissipating substrate 316 comprises a first wavelength converting section 320 with a first wavelength converting material and a second wavelength converting section 322 with a second wavelength converting material. The wheel-shaped heat dissipating substrate 316 further comprises a flat reflection section 324. Thereby, when the wheel-shaped heat dissipation substrate 316 rotates, the first wavelength converting section 320, the second wavelength converting section 322 and the reflection section 324 will enter alternately into the optical path of the blue light beam 328 reflected by the light separating unit 306. As shown in FIG. 8, a first excitation light beam L1 is generated as the first wavelength converting section 320 enters into the optical path of the reflected blue light beam 328'. A second excitation light beam L2 is generated as the second wavelength converting section 322 enters into the optical path of the reflected blue light beam 328'. And a reflecting light beam L3 is generated as the reflection area 324 enters into the optical path of the reflected blue light beam 328'. All of the first excitation light beam L1, the second excitation light beam L2 and the reflecting light beam L3 are transmitted to the back-end device of a projector via the light collecting unit 304.

Figure 10:
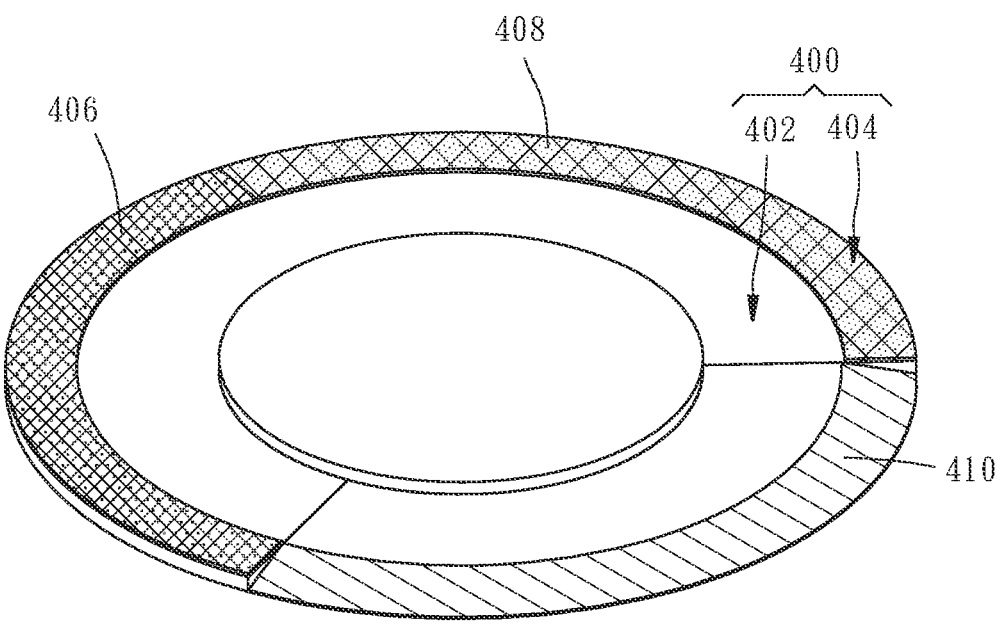
FIG. 10 is a perspective view of a light conversion unit of a light source assembly according to a seventh embodiment of the present invention.

A light source assembly according to a seventh embodiment of the invention is shown in FIG. 10. The light converting unit 400 of the light source assembly of the seventh embodiment comprises a wheel-shaped heat dissipating substrate 402 and a wavelength conversion layer 404 disposed thereon. The wavelength conversion layer 404 comprises a first wavelength converting section 406 with a first wavelength converting material and a second wavelength converting section 408 with a second wavelength converting material. The light converting unit 400 is different from the light converting unit 308 of the light source assembly 300 of the sixth embodiment in that it comprises an inclined reflection section 410 to be used to adjust the direction of the light beam reflected by it.

Figure 11:
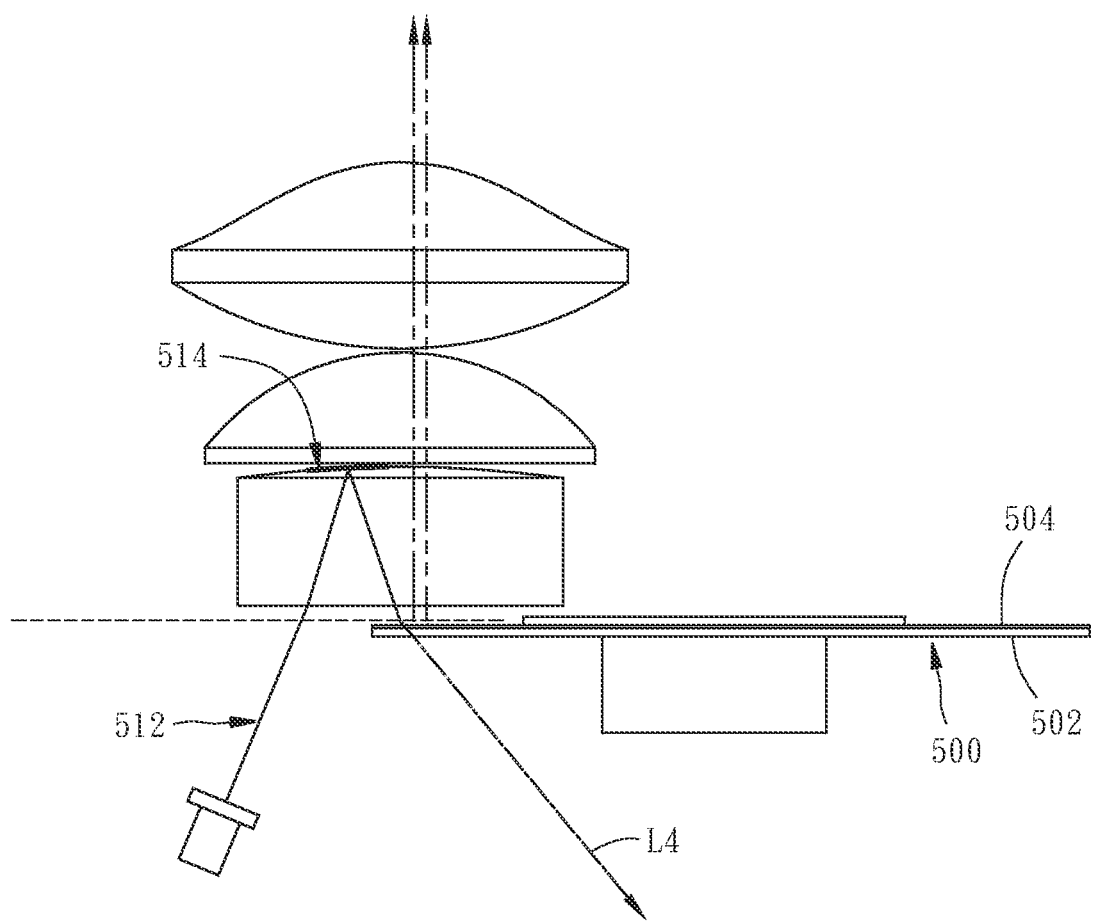
FIG. 11 is a schematic configuration diagram of a light source assembly according to an eighth embodiment of the present invention.
Figure 12:
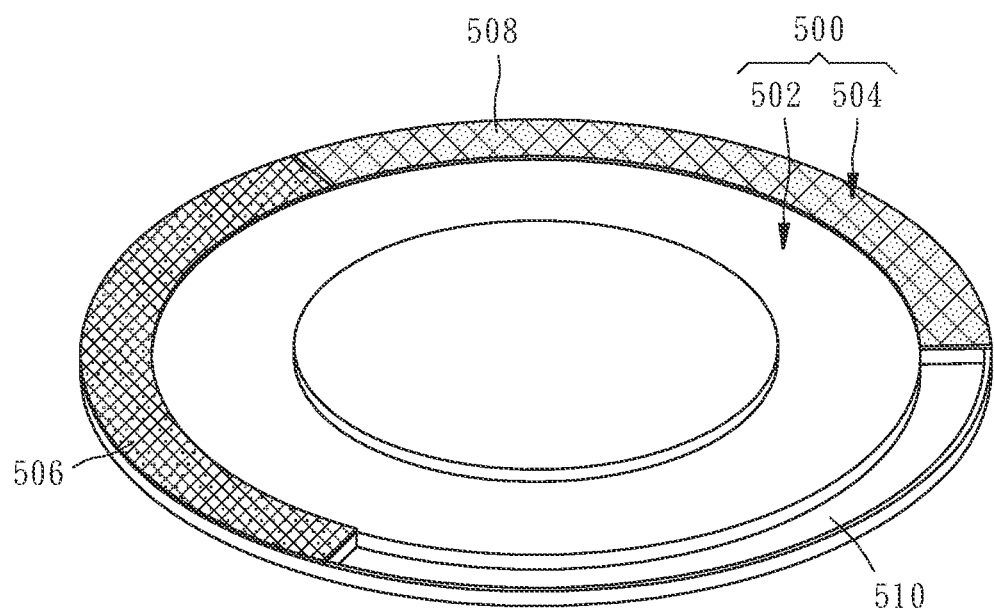
FIG. 12 is a perspective view of a light converting unit of the light source assembly as shown in FIG. 11.
Figure 13:
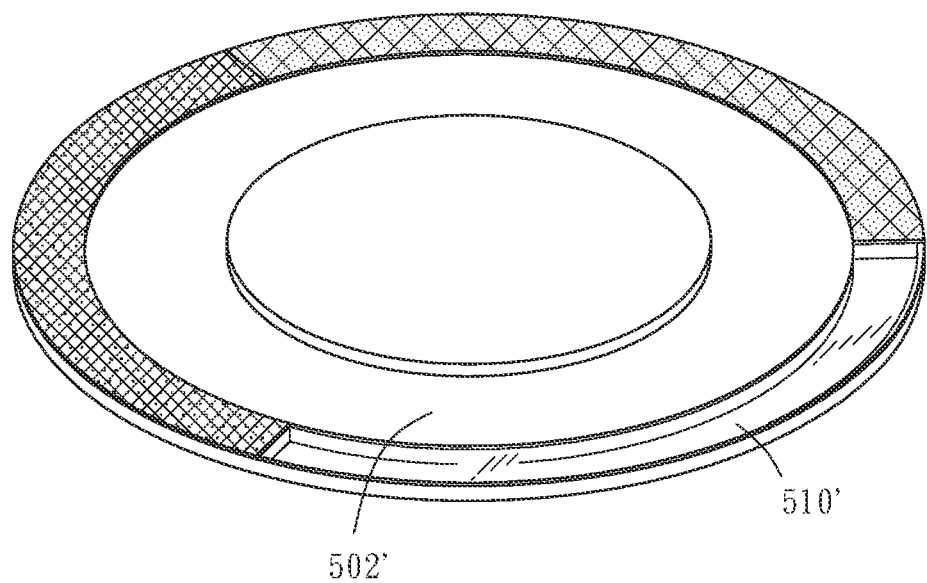
FIG. 13 is a perspective view of a light conversion unit of a light source assembly according to a ninth embodiment of the present invention.

A light source assembly according to an eighth embodiment of the invention is shown in FIGS. 11 and 12. The light source assembly herein comprises a light converting unit 500 including a wheel-shaped heat dissipating substrate 502 and a wavelength conversion layer 504 including a first wavelength converting section 506 and a second wavelength converting section 508. The light converting unit 500 is different from the light converting unit 400 of the seventh embodiment in that it comprises a transmission section 510 so that the blue light beam 512 reflected by the light separating unit 514 can generate a light beam L4 via the transmission section 510. In the eighth embodiment, the transmission section 510 is a hollowed out section disposed on the wheel-shaped heat dissipating substrate 502. In a ninth embodiment, as shown in FIG. 13, a transmission section 510' is disposed on the wheel-shaped heat dissipating substrate 502'. The transmission section 510' is a transmissive flat glass or a transmissive diffuser.

In addition, in some embodiments of the invention, the light source assembly further comprises a diffuser unit or a flyeye lens unit disposed on the optical path of the first light beam between the light source unit and the light collecting unit so that the uniformity of the light spot formed by the light beam of the light source in the light converting unit is improved.

What is claimed is:
1. A light source assembly, comprising
 a light source unit configured to generate a first light beam having a first color and a first optical path;
 a light collecting unit disposed on the first optical path of the first light beam and having a light entering side and a light exiting side, the light collecting unit configured to collimate and condense the light beam incident on the light entering side thereof;
 a light separating unit disposed on an area between the first light entering side and the light exiting side of the light collecting unit for reflecting the first light beam entering from the light entering side of the light collecting unit; and
 a light converting unit configured to absorb the first light beam reflected from the light separating unit and generate a converted light beam being incident on the light entering side of the light collecting unit and exiting outwardly from the light exiting side of the light collecting unit, the converted light beam having a second color.

2. The light source assembly of claim 1, wherein the light source unit comprises a laser light source or an LED-based light source.

3. The light source assembly of claim 1, wherein the light converting unit includes a first plane, the light collecting unit comprises a first plano-convex lens including a first light entering flat surface located near the light entering side thereof, a first light exiting convex surface located near the light exiting side thereof, and an optical axis perpendicular to the first plane of the light converting unit.

4. The light source assembly of claim 3, wherein the light collecting unit further comprises a second plano-convex lens including a second light entering flat surface and a second light exiting convex surface, the second plano-convex lens and the first plano-convex lens are coaxially arranged between the light entering side and the light exiting side of the light collecting unit in such a way that the second light entering flat surface is adjacent to the first light exiting convex surface of the first plano-convex lens.

5. The light source assembly of claim 4, wherein the light separating unit includes a second dichroic coating disposed on a first portion of the second light-entering flat surface of the second plano-convex lens.

6. The light source assembly of claim 5, wherein the light collecting unit further comprises a double-convex aspheric lens including a light entering convex flat surface and a third light exiting convex surface, the double-convex aspheric lens, the first plano-convex lens and the second plano-convex lens are coaxially arranged between the light entering side and the light exiting side of the light collecting unit in such a way that the light entering convex surface is adjacent to the second light exiting convex surface of the second plano-convex lens.

7. The light source assembly of claim 4, wherein the light separating unit includes a dichroic beamsplitter arranged between the first light exiting convex surface of the first plano-convex lens and the second light entering flat surface of the second plano-convex lens.

8. The light source assembly of claim 7, wherein the light collecting unit further comprises a double-convex aspheric lens including a light entering convex flat surface and a third light exiting convex surface, the double-convex aspheric lens, the first plano-convex lens and the second plano-convex lens are coaxially arranged between the light entering side and the light exiting side of the light collecting unit in such a way that the light entering convex surface is adjacent to the second light exiting convex surface of the second plano-convex lens.

9. The light source assembly of claim 3, wherein the light separating unit comprises a first dichroic coating disposed on a first portion of the first light exiting convex surface of the first plano-convex lens.

10. The light source assembly of claim 9, wherein the first optical path of the first light beam is parallel to the first optical axis of the first plano-convex lens.

11. The light source assembly of claim 9, wherein the first optical path of the first light beam intersects the first optical axis of the first plano-convex lens at an angle being greater than 0 degrees and less than 90 degrees.

12. The light source assembly of claim 9, wherein the first light exiting convex surface of the first plano-convex lens has a second portion on which an anti-reflection coating is disposed.

13. The light source assembly of claim 9, wherein the area of the first portion of the first light exiting convex surface is less than or equal to 50% of the entire area of the first light exiting convex surface.

14. The light source assembly of claim 1, wherein the light converting unit includes a wavelength conversion layer and a heat dissipating substrate on which the wavelength conversion layer is disposed.

15. The light source assembly of claim 14, wherein the heat dissipating substrate is rotatable.

16. The light source assembly of claim 15, wherein the wavelength conversion layer includes a first wavelength converting section with a first wavelength converting material and a second wavelength converting section with a second wavelength converting material.

17. The light source assembly of claim 15, wherein the heat dissipating substrate further comprises a reflection section for reflecting the first light beam reflected from the light separating unit.

18. The light source assembly of claim 17, wherein the reflection section includes an inclined reflection surface.

19. The light source assembly of claim 15, wherein the heat dissipating substrate further comprise a transmission section for transmitting the first light beam reflected from the light separating unit.

* * * * *